(12) United States Patent
Raming et al.

(10) Patent No.: US 9,932,690 B2
(45) Date of Patent: Apr. 3, 2018

(54) DEVICE FOR PRODUCING A MONOCRYSTAL BY CRYSTALLIZING SAID MONOCRYSTAL IN A MELTING AREA

(71) Applicant: SILTRONIC AG, Munich (DE)

(72) Inventors: Georg Raming, Tann (DE); Ludwig Altmannshofer, Lenggries (DE)

(73) Assignee: SILTRONIC AG, Munich (DE)

( * ) Notice: Subject to any disclaimer, the term of this patent is extended or adjusted under 35 U.S.C. 154(b) by 135 days.

(21) Appl. No.: 14/417,967

(22) PCT Filed: Jul. 1, 2013

(86) PCT No.: PCT/EP2013/063825
§ 371 (c)(1),
(2) Date: Jan. 28, 2015

(87) PCT Pub. No.: WO2014/019788
PCT Pub. Date: Feb. 6, 2014

(65) Prior Publication Data
US 2015/0203987 A1 Jul. 23, 2015

(30) Foreign Application Priority Data

Aug. 2, 2012 (DE) .................. 10 2012 213 715

(51) Int. Cl.
| C30B 13/20 | (2006.01) |
| C30B 13/30 | (2006.01) |
| C30B 13/16 | (2006.01) |
| C30B 29/06 | (2006.01) |

(52) U.S. Cl.
CPC .............. *C30B 13/20* (2013.01); *C30B 13/16* (2013.01); *C30B 13/30* (2013.01); *C30B 29/06* (2013.01); *Y10T 117/1088* (2015.01)

(58) Field of Classification Search
CPC combination set(s) only.
See application file for complete search history.

(56) References Cited

U.S. PATENT DOCUMENTS 3,108,169 A * 10/1963 Keller ................... C30B 13/30
148/DIG. 74
3,258,314 A * 6/1966 Redmond ............... C30B 13/06
117/222

(Continued)

FOREIGN PATENT DOCUMENTS

| CN | 1197128 A | 10/1998 |
| CN | 1300884 A | 6/2001 |

(Continued)

OTHER PUBLICATIONS

Machine translation of DE 102011014821.*

*Primary Examiner* — Duy Deo
*Assistant Examiner* — Erin Bergner
(74) *Attorney, Agent, or Firm* — Brooks Kushman P.C.

(57) ABSTRACT

A device for producing a single crystal by crystallizing the single crystal in a melt zone, comprising a housing, an inductor for generating heat in the melt zone, a reheater which surrounds and applies thermal radiation to the crystallizing single crystal, and a separating bottom which delimits downward an intermediate space between the reheater and a wall of the housing at a lower end of the reheater.

8 Claims, 2 Drawing Sheets

(56) References Cited

U.S. PATENT DOCUMENTS

| | | | | |
|---|---|---|---|---|
| 3,649,210 | A | * 3/1972 | Keller | C30B 13/16 |
| | | | | 117/204 |
| 4,258,009 | A | * 3/1981 | De Leon | C30B 13/285 |
| | | | | 117/221 |
| 5,556,461 | A | 9/1996 | Kimura et al. | |
| 5,942,032 | A | * 8/1999 | Kim | C30B 15/14 |
| | | | | 117/13 |
| 6,153,008 | A | 11/2000 | Von Ammon et al. | |
| 2002/0195045 | A1 | * 12/2002 | Lu | C30B 15/14 |
| | | | | 117/13 |
| 2004/0055531 | A1 | * 3/2004 | Ferry | C30B 15/14 |
| | | | | 117/217 |
| 2006/0090695 | A1 | * 5/2006 | Chen | C30B 15/14 |
| | | | | 117/217 |
| 2008/0053372 | A1 | * 3/2008 | Anttila | C30B 15/14 |
| | | | | 117/200 |
| 2011/0095018 | A1 | 4/2011 | von Ammon et al. | |

FOREIGN PATENT DOCUMENTS

| | | | | |
|---|---|---|---|---|
| CN | 102321910 A | | 1/2012 | |
| CN | 102321913 A | | 1/2012 | |
| DE | 30 07 377 A1 | | 9/1981 | |
| DE | 694 03 275 T2 | | 12/1997 | |
| DE | 102011014821 | * | 9/2011 | ............ C30B 13/30 |
| JP | S63-81867 U | | 5/1988 | |
| JP | 2008222481 A | | 9/2008 | |
| JP | 2009001489 A | | 1/2009 | |
| WO | 2008025872 A2 | | 3/2008 | |

\* cited by examiner

DEVICE FOR PRODUCING A MONOCRYSTAL BY CRYSTALLIZING SAID MONOCRYSTAL IN A MELTING AREA

CROSS REFERENCE TO RELATED APPLICATIONS

This application is the U.S. National Phase of PCT Appln. No. PCT/EP2013/063825 filed Jul. 1, 2013, which claims priority to German Application No. 10 2012 213 715.7 filed Aug. 2, 2012, the disclosures of which are incorporated in their entirety by reference herein.

BACKGROUND OF THE INVENTION

1. Field of the Invention

The invention relates to a device for producing a single crystal by crystallizing the single crystal in a melt zone. The device is suitable in particular for the production of a silicon single crystal.

2. Description of the Related Art

DE 30 07 377 A1 describes a known embodiment of a device for crystallizing a single crystal in a wet zone, and a method which is referred to as a zone melting method or FZ method. This embodiment comprises a housing in which a pulling shaft and an inductor are accommodated. At the upper end of the pulling shaft, there is a seed crystal on which molten silicon crystallizes, initially to form a section with a narrowed diameter and subsequently to form a single crystal. The inductor, an RF induction heating coil formed as a flat coil, causes polycrystalline silicon at the lower end of a rod to melt and generates and stabilizes a melt zone, which delivers the material that the single crystal requires in order to grow. The polycrystalline rod and the single crystal are lowered, in order to permit continuous growth of the single crystal.

A variant of the FZ (floating zone) method is the GFZ (granular floating zone) method, which is described for example in US 2011/0095018 A1. In the GFZ method, polycrystalline granules are used instead of a rod as raw material. Furthermore, two induction heating coils are provided, a first for melting the granules and a second for stabilizing the melt zone by generating heat in the melt zone.

The temperature field in the melt zone and in the cooling single crystal, particularly in the region of the crystallization boundary, must be controlled as precisely as possible. In particular, it is necessary to counteract steep temperature gradients which cause thermal stresses and may be the origin of dislocation formation even to the extent of destroying the single crystal by cracking. In order to control the temperature field, it has been found to be advantageous to provide a reflector which surrounds the growing single crystal and reflects thermal radiation onto it.

In addition to the use of a reflector, CN 10232191 A proposes to use a transverse magnetic field in order to suppress fluctuations of the temperature in the melt zone.

SUMMARY OF THE INVENTION

It is an object of the present invention, particularly in the region of the crystallization boundary, to avoid disruption of the temperature field which cannot be eliminated either by the use of a reflector or by the generation of a magnetic field. These and other objects are achieved by a device for producing a single crystal by crystallizing the single crystal in a melt zone, comprising a housing, an inductor for generating heat in the melt zone, a reheater which surrounds and applies thermal radiation to the crystallizing single crystal, and a separating bottom which delimits downward an intermediate space between the reheater and a wall of the housing at a lower end of the reheater.

BRIEF DESCRIPTION OF THE DRAWINGS

The invention is explained in more detail below using drawings.

DETAILED DESCRIPTION OF THE PREFERRED EMBODIMENTS

Figure 1:
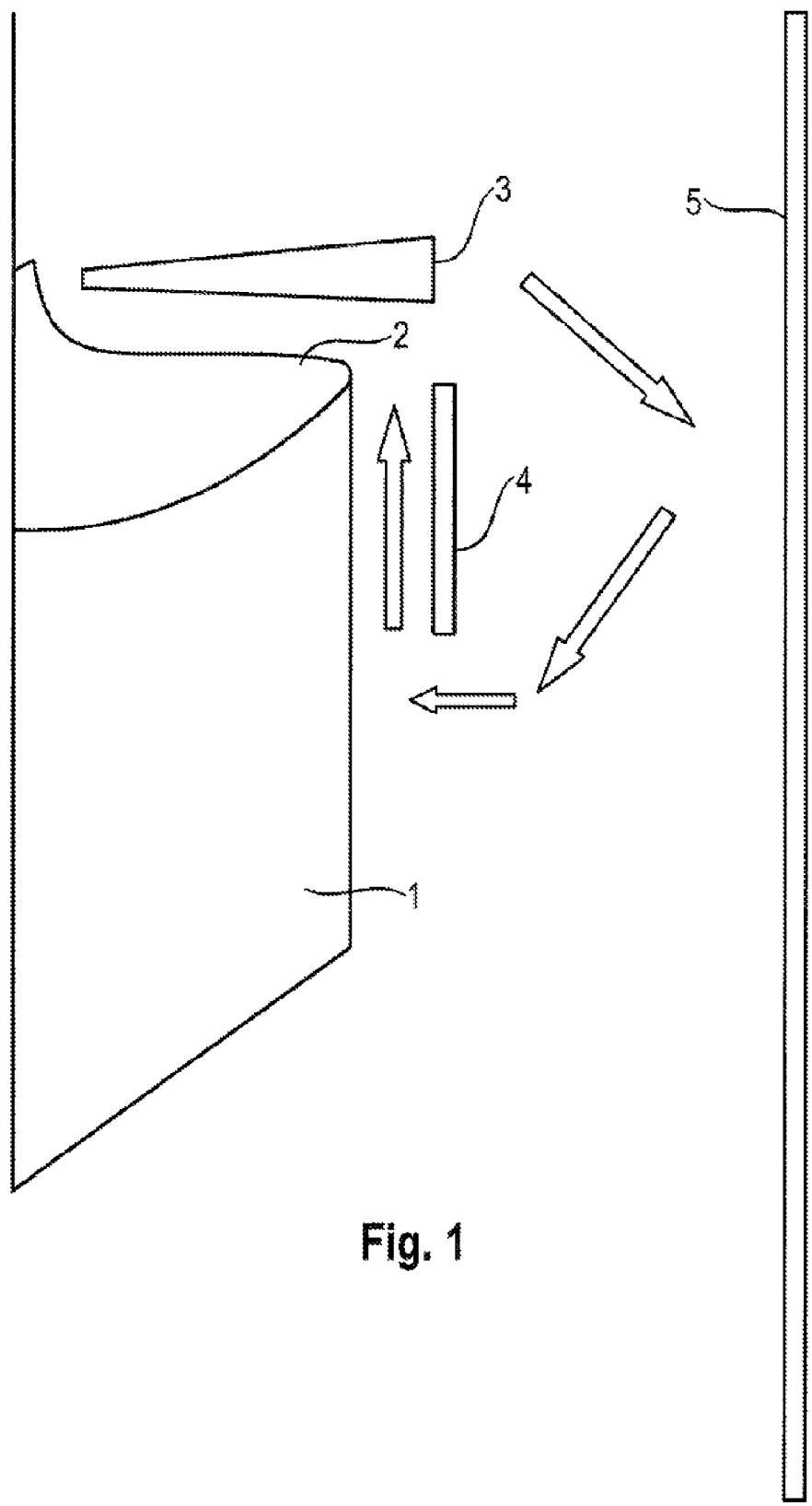
FIG. 1 is a schematic representation which represents the prior art.

The reheater is preferably a reflector or an active radiating heater, for example a heating resistor.

Disruption of the temperature field is caused by the thermal expansion of protective gas, for example argon, in the housing, as a result of which heat is drawn in an uncontrollable way from the crystallizing single crystal and the melt zone.

Conventional measures such as applying a positive pressure of protective gas to the housing in order to avoid secondary reactions and in order to prevent electrical sparking at the inductor or at its electrical leads, and arranging a reflector around the crystallizing single crystal, promote the creation of convection which is stimulated by thermal expansion of protective gas. The intermediate space between the crystallizing single crystal and the reflector thus acts as a vent, which promotes the thermal expansion of protective gas.

The aim of the present invention is to substantially prevent disruptive thermal expansion of protective gas. This aim is achieved by a separating bottom, which stands in the way of the flowing protective gas as a barrier. The separating bottom is arranged in the housing in such a way that an intermediate space between the reheater and a wall of the housing is delimited downward by it at a lower end of the reheater.

It is furthermore preferable for gaps, which may be present between the reheater and the separating bottom and between the wall of the housing and the separating bottom, to be shortened or closed by means of barriers, in order to hinder the thermal expansion of the protective gas even more strongly or entirely block it. Suitable barriers are for example rings of metal such as, for example, steel, silver or quartz glass, which cover the gaps. The gap between the wall of the housing and the separating bottom is preferably covered with a ring of steel, and the gap between the reheater and the separating bottom is preferably covered with a ring of silver or quartz glass.

The arrangement of the separating bottom prevents protective gas from drawing heat from the melt zone and the crystallizing single crystal in an uncontrolled way, and therefore also consequential damage which can occur owing to the resulting disruption of the temperature field. Furthermore, the lack of heat extraction has further advantages. The heating power of the inductor can be reduced, which makes events such as electrical sparking at the inductor or at its electrical leads less likely and reduces thermal stresses in the crystallizing single crystal.

The upper edge of the reheater preferably lies at the level of the triple point of the crystallization boundary. The reheater has an axial length which is preferably not longer than 1.5 times the diameter of the single crystal to be produced. The radial distance between the single crystal and the repeater is preferably not more than 30 mm, a radial distance from 10 mm to 20 mm being particularly preferred.

The invention is preferably used for the production of silicon single crystals having a comparatively large diameter of at least 150 mm. Both the FZ method and the GFZ method may be envisioned as production methods.

FIG. 1 shows a sectional representation of a device for producing a single crystal by crystallizing the single crystal in a melt zone. This device may be equated to the prior art. Only features which contribute to the explanation of the invention are represented. The single crystal 1 grows in a melt zone 2, which is supplied with heat by an inductor 3. Arranged at the level of the triple point ETP, there is a reflector 4 which surrounds the crystallizing single crystal and has an axial length which is shorter than the length of the single crystal being produced. The reflector 4 divides the interior of a housing into an intermediate space between the crystallizing single crystal 1 and the reflector 4 and an intermediate space between the reflector 4 and the wall 5 of the housing. Block arrows indicate the closed path of a flow of a protective gas contained in the housing, driven by thermal expansion.

Figure 2:
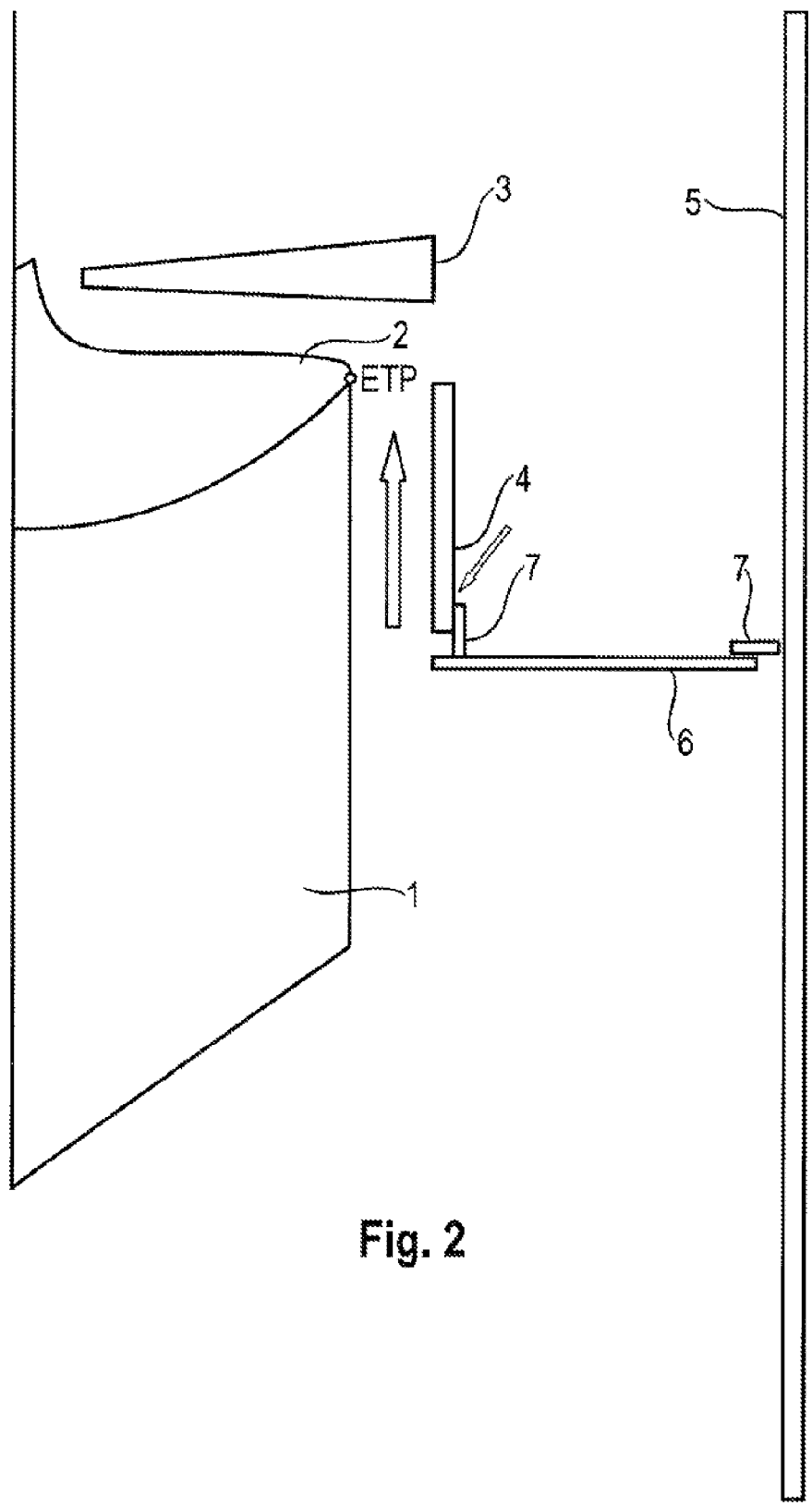
FIG. 2 is a schematic representation of the invention.

FIG. 2 shows a device according to FIG. 1, and additionally, features of the invention. Features which are of the same type are provided with the same reference numbers. The device according to the invention is distinguished by a separating bottom 6, which delimits the intermediate space between the reflector 4 and the wall 5 of the housing downward. The reflector 4 may be replaced by an active radiation heater. Block arrows depicted as thinner in comparison with FIG. 1 show a gas flow, driven by thermal expansion, which is greatly impeded owing to the arrangement of the separating bottom 6.

The gas flow may be impeded even more strongly up to the extent of full blockage, preferably by arranging barriers 7 on outer sides of the separating bottom 6, which shorten or close gaps between the reflector 4 and the separating bottom 6 and between the separating bottom 6 and the wall 5 of the housing.

The invention claimed is:

1. A device for producing a single crystal by crystallizing the single crystal in a melt zone, comprising a housing, an inductor for generating heat in the melt zone, a reheater below the melt zone which surrounds and applies thermal radiation to the crystallizing single crystal, the single crystal crystallizing below the melt zone, and a separating bottom which delimits an intermediate space between the reheater and a wall of the housing downward at a lower end of the reheater, wherein barriers are arranged on outer sides of the separating bottom to shorten or close gaps between the reheater and the separating bottom and between the separating bottom and the wall of the housing.

2. The device of claim 1, wherein the reheater is a reflector.

3. The device as claimed in claim 1, wherein the reheater is an active radiating heater.

4. The device of claim 1, wherein an upper edge of the reheater lies at the level of a triple point of a crystallization boundary.

5. The device of claim 4, wherein the reheater has an axial length which is not larger than 1.5 times a diameter of the single crystal produced.

6. The device of claim 1, wherein the barriers arranged on outer sides of the separating bottom between the separating bottom and the wall of the housing are constructed of steel.

7. The device of claim 1, wherein the barriers arranged between the outer sides of the separating bottom and the reheater are constructed of silver or quartz glass.

8. The device of claim 1, wherein the barriers reduce or eliminate convective flow of gas to the melt zone.

* * * * *